(12) United States Patent
Woerner

(10) Patent No.: US 7,516,543 B2
(45) Date of Patent: Apr. 14, 2009

(54) METHOD FOR MANUFACTURING SEMICONDUCTOR COMPONENT WITH A MEDIA CHANNEL

(75) Inventor: Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 11/448,991

(22) Filed: Jun. 8, 2006

(65) Prior Publication Data

US 2006/0278978 A1 Dec. 14, 2006

(30) Foreign Application Priority Data

Jun. 8, 2005 (DE) .................. 10 2005 026 528

(51) Int. Cl.
*H05K 3/30* (2006.01)
(52) U.S. Cl. .................. 29/841; 29/412; 29/832; 73/53.01; 204/400
(58) Field of Classification Search .................. 29/595, 29/830, 832, 841, 412, 415; 73/53.01, 754; 204/400; 216/49, 56; 257/754; 422/58, 422/100; 435/288.5; 522/150, 162
See application file for complete search history.

(56) References Cited

U.S. PATENT DOCUMENTS

| 5,304,487 | A | * | 4/1994 | Wilding et al. | ................. 216/56 |
| 5,932,799 | A | * | 8/1999 | Moles | ........................ 73/53.01 |
| 6,136,212 | A | * | 10/2000 | Mastrangelo et al. | ......... 216/49 |
| 2004/0132855 | A1 | * | 7/2004 | Kohl et al. | .................. 522/150 |
| 2005/0155411 | A1 | | 7/2005 | Rogalla et al. | |

FOREIGN PATENT DOCUMENTS

| DE | 102 07 393 A1 | 9/2003 |
| DE | 102 46 283 B3 | 3/2004 |
| DE | 103 15 068 B3 | 8/2004 |
| DE | 103 10 615 B3 | 11/2004 |
| DE | 103 49 839 A1 | 6/2005 |
| WO | WO 02/072264 A1 | 9/2002 |

OTHER PUBLICATIONS

Bhusari Dhananjay, et al., "Fabrication of Air-Channel Structures for Microfluidic, Microelectromechanical and Microelectronic Applications", *Journal of Microelectromechanical Systems*, vol. 10, No. 3, Sep. 2001, IEEE pp. 400-406.

(Continued)

*Primary Examiner*—Donghai D Nguyen
(74) *Attorney, Agent, or Firm*—Edell, Shapiro & Finnan, LLC

(57) ABSTRACT

A semiconductor component includes a media channel and at least the following components: a semiconductor chip on a wiring substrate, electric connecting elements disposed between the semiconductor chip and the wiring substrate, and a plastic housing mass that embeds these components. The media channel is impressed into the plastic housing mass and extends along the interfaces between the plastic housing mass and the components. The media channel is produced by applying a sacrificial polymer including a media channel structure to the components before embedding the components in the plastic housing mass. The sacrificial polymer is then destroyed after the components are embedded, thereby forming the media channel.

11 Claims, 7 Drawing Sheets

OTHER PUBLICATIONS

Promerus, "Unity™ 400 Datasheet Unity™ Sacrificial Polymer Processing Overview", *Promerus Electronic Materials*, Promerus, LLC Cleveland, Ohio, pp. 1-6.

Heuschkel, M.O., et al., "Buried Microchannels in Photopolymer for Delivering of Solutions to Neurons in a Network", *Sensors and Actuators*, B 48, 1998, pp. 356-361, Institute of Microsystems, Geneva, Switzerland.

Jackman, Rebecca, et al., "Microfluidic Systems with On-line UV Detection Fabricated in Photodefinable Epoxy", *Journal of Micromechanics and Microengineering*, Institute of Physics Publishing, Mar. 2001.

* cited by examiner

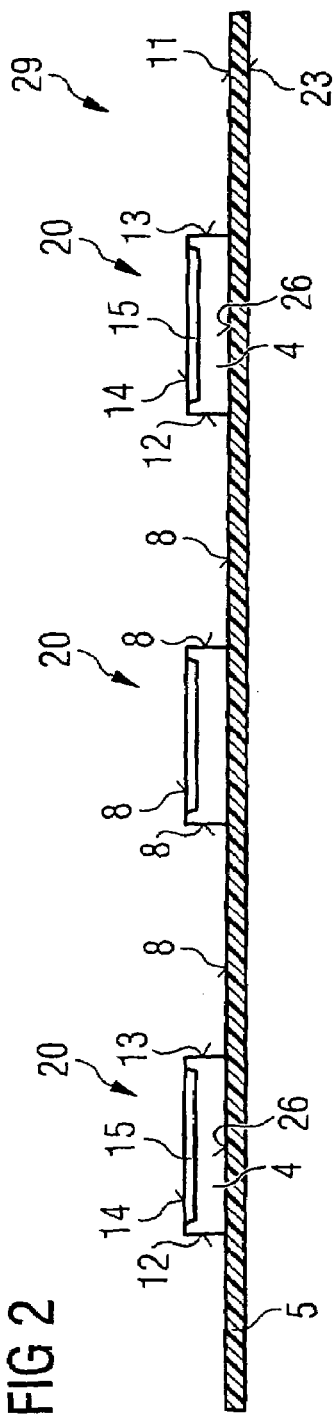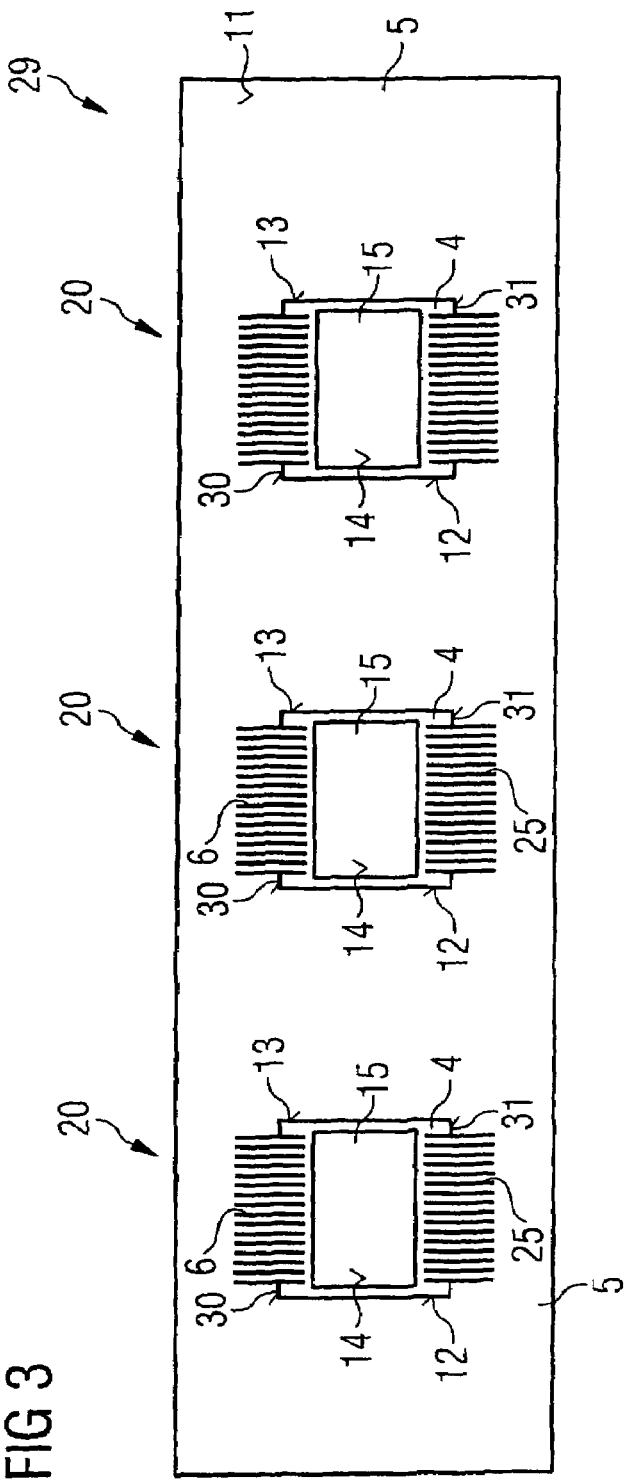

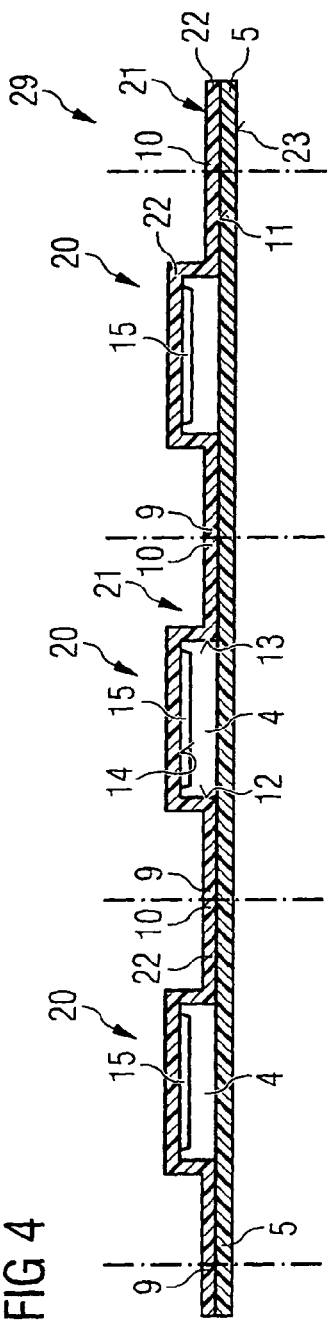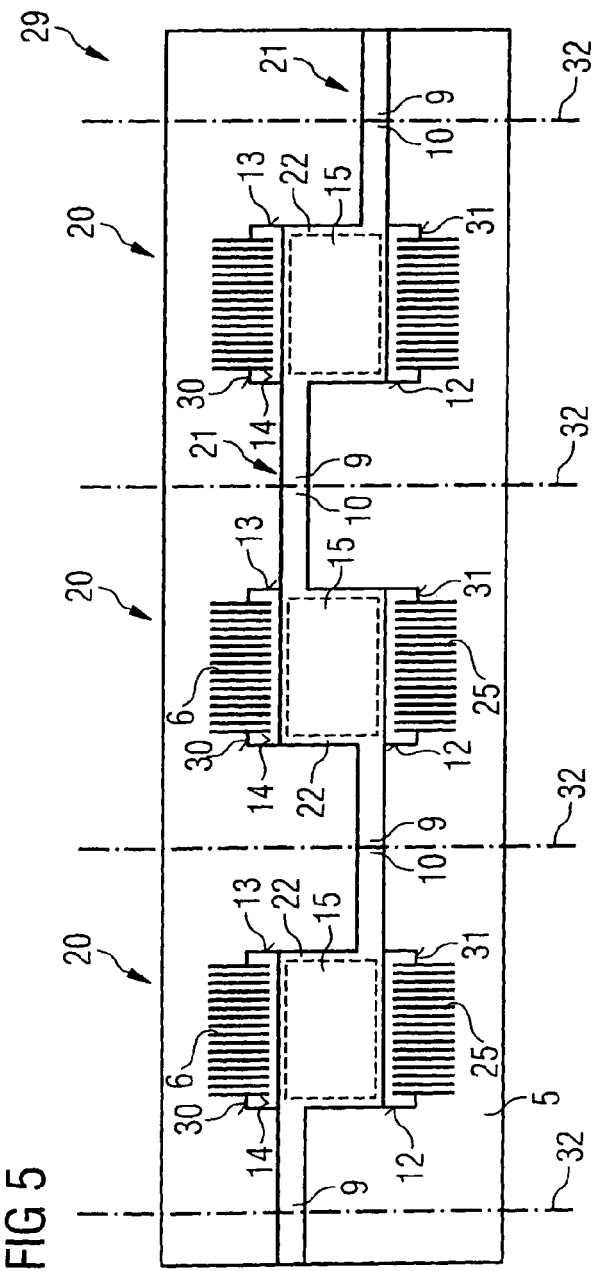

METHOD FOR MANUFACTURING SEMICONDUCTOR COMPONENT WITH A MEDIA CHANNEL

CROSS REFERENCE TO RELATED APPLICATIONS

This application claims priority to German Application No. DE 10 2005 026 528.6, filed on Jun. 8, 2005, and titled "Semiconductor Component with a Media Channel and Method for Manufacturing Same," the entire contents of which are hereby incorporated by reference.

FIELD OF THE INVENTION

The invention relates to a semiconductor component with a media channel and methods of manufacturing the same.

BACKGROUND

As is described in *IEEE Journal of Microelectromechanical Systems,* vol. 10, No. 3, September 2001, microscopically small air channel structures for microfluid, microelectromechanical and microelectronic applications may be formed with the help of sacrificial polymer structures on semiconductor chips. However, the problem of the crossover from media channels to the top sides of the semiconductor chips in suitably adapted channels of a plastic housing mass is not solved with these structures. Thus the problem of supplying and removing microfluid media to and from the semiconductor chips within a plastic housing mass remains unsolved.

The publication DE 103 10 615 B3 discloses a biochip and a method of manufacturing same, where open microchannels are introduced into a photoresist layer on the surface of a semiconductor wafer, and these open microchannels are then covered by a joint or individual covering panel. This method is also limited to the manufacture of microchannels on a semiconductor wafer and/or on a semiconductor chip and does not solve the problem of the crossover from the microchannels on the semiconductor chip to adapted media channels in a plastic housing mass.

The publication DE 102 46 283 B3 discloses metallic sacrificial parts which are embedded in a plastic housing mass of a semiconductor component to then produce channels and cavities in the semiconductor housing of a plastic housing mass by etching away the metallic sacrificial parts. These semiconductor components have the disadvantage that the channels cannot be manufactured in just any channel structure because before embedding them in a plastic housing mass, metallic sacrificial parts must be prefabricated and prepared and then adjusted, applied and finally embedded in the plastic housing mass. Etching away the metal parts after embedding them in the plastic housing mass is also not without problems.

For biosensors, gas sensors or fluid sensors, however, the liquids or gases should be supplied and removed again through defined areas of a semiconductor chip. Supplying such media thus constitutes a problem, especially since corresponding channels and cavities must also be produced over the sensor area in a semiconductor housing. The channels must be laid out in such a way that areas of the component that should not come in contact with the media are reliably sealed. These problems are not solved with the sensors mentioned above because they are limited to channel structures and cavities on semiconductor chip surfaces and do not take into account the required channels and cavities in the plastic housing mass or they solve the problem of these crossovers with complex sacrificial metal structures.

The methods of manufacturing media channels mentioned above also have the following disadvantages:
1. the processes used are not standard assembly processes and are not compatible with existing semiconductor technology processes;
2. the methods mentioned above are suitable only for a small number of parts because they have a low degree of automation and therefore cannot be used for mass production; and
3. the miniaturization possibilities of the methods mentioned above are extremely limited because of the required coverage of open media channels or because of the installation of sacrificial metal parts.

The methods mentioned above are associated with high assembly costs.

SUMMARY

The present invention overcomes the disadvantages of the state of the art and provides a semiconductor component with media channels that can have virtually any structurable media channel structure and is inexpensive to manufacture by mass production.

According to the invention, a semiconductor component with a media channel comprises a semiconductor chip, a wiring substrate, electric connecting elements disposed between the semiconductor chip and the wiring substrate and a plastic housing mass in which these components are embedded. The media channel is impressed into the plastic housing mass and extends along the interfaces between the plastic housing mass and the components of the semiconductor component.

This semiconductor component has the advantage that the media channel is not limited to the surface of the semiconductor chip but instead extends along all the interfaces between the plastic housing mass and the components such as the wiring substrate and the semiconductor chip. The medium in the form of fluids or gas may thus also be guided advantageously outside of the interface between the semiconductor chip and the plastic housing mass. For example, the medium may be supplied on the top side of the wiring substrate and then reach the top side of the semiconductor chip over the edge sides of the semiconductor chip. This is because the edge sides and the top side of the semiconductor chip likewise form interfaces with the plastic housing mass into which the media channel is impressed. Thus, the medium may be guided out over interfaces between the wiring substrate and the plastic housing mass which are arranged so they are separated locally from the area of introduction of the medium into the media channel, e.g., on the wiring substrate. It is also possible to have the feed area of the media channel begin on the surface of the semiconductor chip and to lead from there to an interface between the plastic housing mass and the surface of the wiring substrate as well as vice versa.

The semiconductor component with the inventive media channel which is impressed into the plastic housing mass and extends along the interface between the plastic housing mass and the components of the semiconductor component opens up the possibility of supplying and removing media to and from the sensor area of a semiconductor chip through a plastic housing mass of any desired design in the interfacial area between the components and the plastic housing mass.

In an exemplary embodiment of the invention, the media channel includes at least one inlet area and one outlet area. In this preferred embodiment of the invention, both the inlet area and the outlet area are arranged on the wiring substrate and/or on the semiconductor chip and protrude from the wiring substrate and/or the semiconductor chip into the plastic housing mass. This embodiment of the invention has the advantage that relatively any cross-sections of the media channel are implemented, with the only limit being the thickness of the plastic housing mass. This means that the channel height must not exceed the thickness of the plastic housing mass, because otherwise the media channel would be open and/or would be exposed on the top side of the component.

In addition, the media channel can extend along the top side of the wiring structure and along at least one edge side of the semiconductor chip as well as along the top side of the semiconductor chip. This achieves the result that the medium introduced, for example, over the edge sides of the semiconductor chip and the top side of the semiconductor chip can flow toward the wiring substrate or in the opposite direction.

In a further embodiment of the invention, the semiconductor chip includes a sensor area, where the media channel extends at least partially on the sensor area of the semiconductor chip. This has the advantage that the media channel, which is on the edge sides of the semiconductor chip as well as on the top side of the wiring substrate, forms a cavity in which the medium can contact the sensitive area of the semiconductor chip only in limited areas of the top side of the semiconductor chip. Areas of the active top side of the semiconductor chip which have, for example, nonsensitive components such as transistors, diodes or contact terminal faces, are automatically protected from the medium by the plastic housing mass because the top side of the semiconductor chip is only partially covered by the media channel.

In another exemplary embodiment of the invention, a network of media channels is provided, these channels being impressed into the plastic housing mass at the interfaces of the components. In addition, the semiconductor component can include at least one inlet opening and one outlet opening which are connected by connecting channels to the inlet areas and the outlet areas, respectively. Since the media channels are arranged on the interfaces of the components with the plastic housing mass, a simple and relatively inexpensive solution can be achieved by the fact that an inlet opening and an outlet opening are preferably arranged on opposite edge sides of the semiconductor component. This inlet opening and this outlet opening are automatically exposed in separation of a panel, for example, with multiple semiconductor components.

In another embodiment of the invention, the semiconductor component includes an inlet opening and an outlet opening which are arranged on the top side of the semiconductor component, where vertical connecting channels connect the inlet opening and/or the outlet opening to an inlet area and/or an outlet area on the wiring substrate and/or on the semiconductor chip. In this embodiment, the connecting channel does not extend in the plane of the media channels, which are arranged on the interfaces between the components and the plastic housing mass, as mentioned above, but instead the connecting channels are formed vertically in this embodiment of the invention and are created in the plastic mass by a separate process step. This process step can be performed in an inexpensive operation with the help of laser ablation by creating vertical connecting channels to the inlet area and/or outlet area arranged on the interfaces on the wiring substrate and/or on the semiconductor chip, starting from the top side of the semiconductor component.

In another embodiment of the invention, the semiconductor component includes a plurality of semiconductor chips and thus forms a semiconductor module, where the above-mentioned network of media channels is arranged in the plastic housing mass on the interface between the plastic housing mass and the components of the semiconductor component. In addition, the semiconductor chip can include a biosensor, a gas sensor or a fluid sensor which are supplied with the media through appropriate media channels on the interface between the components and the plastic housing mass.

A method for manufacturing a semiconductor component with a media channel comprises the following method steps. First, a wiring substrate including a plurality of semiconductor component positions is manufactured. Then, the wiring substrate is assembled with semiconductor chips in the semiconductor component positions. Next, a media channel structure of sacrificial polymers is applied to the top side of the wiring substrate and to the edge sides and the top sides of the semiconductor chip. Then, the wiring substrate is electrically connected to the semiconductor chips by electric connecting elements in the respective semiconductor component positions. Finally, the wiring substrate with semiconductor chips and the connecting elements and the media channel structure are embedded in a plastic housing mass.

Next, the wiring substrate is heated to a decomposition temperature of the sacrificial polymers, with the resulting volatile decomposition products diffusing through the plastic housing mass and with media channels being formed. Finally, the wiring substrate with the plastic housing mass, the media channels formed therein and also the semiconductor chips and their connecting elements is separated into individual semiconductor components with their media channels.

This method has the advantage that virtually any media channel structure can be formed in any of the semiconductor component positions with the help of the sacrificial polymers. The sacrificial polymers may be applied to a panel and structured with known semiconductor technology processes, so these methods are completely compatible with traditional semiconductor manufacturing processes and are also suitable for mass production.

Before separating the wiring substrate into individual semiconductor components in the individual semiconductor component positions, the bottom side of the wiring substrate can be assembled with external contacts. Solder balls are preferred as the external contacts and can be soldered at the corresponding locations on the bottom side of the wiring substrate in an automated process. In addition, it is provided that the electric connection of the wiring substrate to the semiconductor chips is accomplished by bonding bond wires between contact faces of the semiconductor chips and contact terminal faces of the wiring substrate in the semiconductor component positions. In this case, it is advantageous if such bonding is performed only after applying a media channel structure of sacrificial polymers to be able to optimally perform the application of the media channel structure without having to take into account the sensitive bond connections.

In another exemplary embodiment of the method, the electric connection of the wiring substrate to the semiconductor chips is accomplished by soldering flip-chip contacts of the semiconductor chip to contact terminal faces of the wiring substrate in the component positions. With this type of electric connection, a media channel structure of sacrificial polymer is applied to the top side of the wiring substrate and the edge sides and top sides of the semiconductor chip after electrically connecting the semiconductor chip to the wiring substrate if the back side of the semiconductor chip has a sensor area.

However, if the sensor area in the semiconductor chip with flip-chip contacts is on the top side having the flip-chip contacts, then a media channel structure of sacrificial polymer is applied before placing the semiconductor chip with its flip-chip contacts on the wiring substrate. An advantage of the latter method variant is that the media channel structure can be completely applied to the surface of the wiring substrate and no edge sides of semiconductor chip need be overcome.

Various techniques are available for applying the media channel structure of sacrificial polymers. Printing techniques such as a screen printing technique, stencil printing technique or jet printing technique are preferably used. Whereas a corresponding mask of a screen or a stencil must be supplied in the screen printing technique and the stencil printing technique, the sacrificial polymer may be printed without a mask in the semiconductor component positions of the wiring substrate in the jet printing technique as in inkjet printing.

However, it is completely compatible with traditional semiconductor processes if, for applying the media channel structure, first a self-contained layer of a sacrificial polymer is applied to the wiring substrate assembled with semiconductor chips. Then, the sacrificial polymer layer is structured by photo-lithography. This procedure is standardized and may result in extremely precise and microscopically small structures. The wiring substrate with semiconductor chips, connecting elements and media channel structure may be embedded in a plastic housing mass by means of dispensing techniques or by means of injection molding techniques and/or by molding. It is only necessary to be sure that the plastic housing mass has a higher decomposition temperature than the sacrificial polymer.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 2 depicts a schematic cross-section through a wiring substrate with multiple semiconductor component positions assembled with semiconductor chips in the semiconductor component positions in a method of the manufacture of the semiconductor component according to the invention.

FIG. 3 depicts a schematic top view of the wiring substrate according to FIG. 2 after applying connecting elements between the semiconductor chips and the wiring substrate in the semiconductor component positions.

FIG. 4 depicts a schematic cross-section through a wiring substrate according to FIG. 3 after applying a media channel structure.

FIG. 5 depicts a schematic top view of the wiring substrate according to FIG. 4.

DETAILED DESCRIPTION

Figure 1:
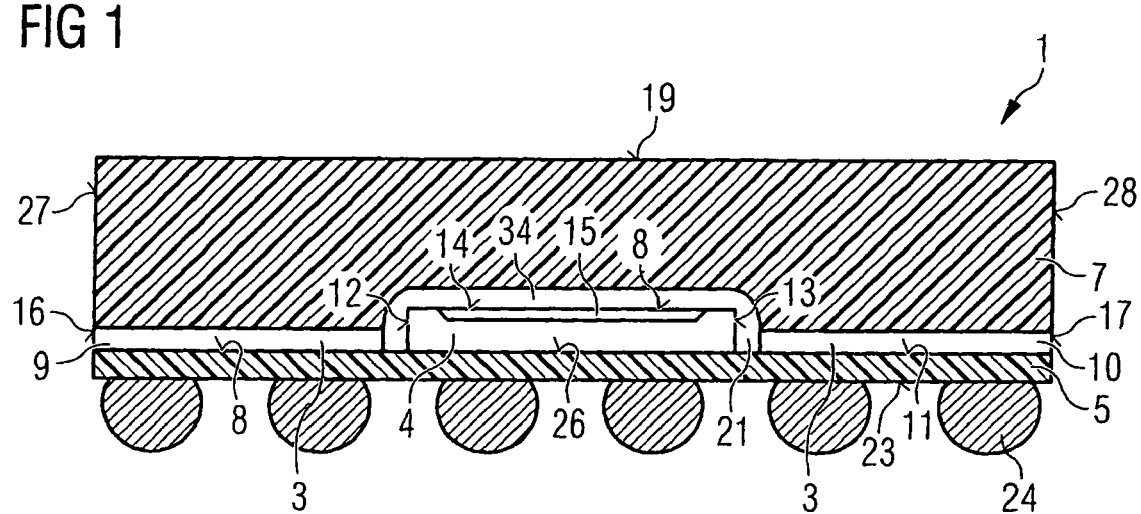
FIG. 1 depicts a schematic cross-section through a semiconductor component with a media channel according to a first embodiment of the invention.

FIG. 1 shows a schematic cross-section through a semiconductor component 1 with a media channel 3 according to a first embodiment of the invention. The semiconductor component 1 includes a wiring substrate 5 with a top side 11. A semiconductor chip 4 is arranged with its back side 26 on the top side 11 of the wiring substrate 5. The wiring substrate 5 has contact terminal faces (not shown here) on its top side 11 and is electrically connected to corresponding contact faces (not shown here) on the active top side 14 of the semiconductor chip 4 by bond wires (not shown here). These connecting elements that are not shown are bond wires that are embedded in a plastic housing mass 7 and are not in the media channel 3 shown in cross-section here.

The media channel 3 extends on the interfaces 8 between the plastic housing mass 7 and the components of the semiconductor component 1, namely on the top side 11 of the wiring substrate 5, the edge sides 12 and 13 of the semiconductor chip 4 and the surface 14 of the semiconductor chip 4. The media channel 3 protrudes into the plastic housing mass 7 and in this first embodiment of the invention has an inlet opening 16 in an inlet area 9 of the media channel 3, said inlet opening being arranged on the edge side 27 of the semiconductor component 1. On the opposite edge side 28 of the semiconductor component 1, the media channel 3 opens into an outlet opening 17 in the outlet area 10 of the media channel 3. The inlet opening 16 and the outlet opening 17 are formed automatically in separating a panel with a plurality of semiconductor component positions arranged thereon. It is thus possible to inexpensively create such semiconductor components having lateral openings 16 and 17 for media inlet and/or media outlet.

Since the media channel 3 extends on the interfaces 8 of the components of the semiconductor component 1, the medium may be guided from the inlet area 9 on the top side 11 of the wiring substrate 5 to the edge area 12 of the semiconductor chip 4 and flow over the edge area 12 to the active top side 14 of the semiconductor chip 4 and over the sensor area 15 arranged there to the outlet area 10 of the media channel 3 on the wiring substrate 5 and emerge from the outlet opening 17 on the edge side 28 of the semiconductor component 1. The media channel 3 may expand over the area in the sensor area 15 such that a cavity keeps the entire sensor area 15 free. The medium may then flow into the media channel 3 to the outlet area 10 over the edge side 13 of the semiconductor component 4 as another interface.

To carry the measurement signals outward, the semiconductor component 1 has external contacts 24 on the bottom side 23 of the wiring substrate 5. These external contacts 24 are in turn electrically connected to the abovementioned contact terminal faces on the top side 11 of the wiring substrate 5. These internal electric connections and connecting elements cannot be seen in this cross-sectional view, however, because they are embedded in the plastic housing mass 7 outside of the media channel 3.

FIGS. 2 through 10 show schematic diagrams of the manufacture of a semiconductor component 1 according to FIG. 1. Components having the same functions as in FIG. 1 are labeled with the same reference numerals in FIGS. 2 through 10 and will not be described separately.

FIG. 2 shows a schematic cross-section through a wiring substrate 5 with a plurality of semiconductor component positions 20 assembled with semiconductor chips 4 in the semiconductor component positions 20. The semiconductor chips 4 are arranged with their back sides 26 on the top side 11 of the wiring substrate 5. The active top side 14 of the semiconductor chips 4 with the sensor area 15 is freely accessible in FIG. 2. Such a wiring substrate 5 having a plurality of semiconductor component positions 20 is also known as a panel 29.

FIG. 3 shows a schematic top view of the wiring substrate 5 according to FIG. 2 after applying connecting elements 6 between the semiconductor chips 4 and the wiring substrate 5 in the semiconductor component positions 20. In this embodiment of the invention, only one wiring substrate strip with a single row of semiconductor component positions 20 is shown. However, it is also possible for the semiconductor component positions 20 to be arranged in rows and columns on a large wiring substrate 5.

Each of the semiconductor chips 4 has at its center a sensor area 15 where the connecting elements 6 in the form of bond wires 25 are arranged on contact faces of the semiconductor chip 4 outside of the actual sensor area 15. In this embodiment of the invention, it is noteworthy that the edge sides 12 and 13 of the semiconductor chip 4 are kept free of bond connections, and bond connections extend only on the edge sides 30 and 31. This is advantageous for the remaining course of the manufacturing process as shown in the following FIGS. 4 through 10.

FIG. 4 shows a schematic cross-section through the wiring substrate 5 according to FIG. 3 after application of a media channel structure 21. The media channel structure 21 is formed by a sacrificial polymer 22 that has a metal content of less than 5 ppm and can be applied by a centrifugal spraying method. In an inert gas atmosphere, the solvent of this polymer can be evaporated, forming a thermoplastic within 2 hours at approximately 200° C. The media channel structure 21 can be prepared with the help of standard photolithography techniques and structured by reactive ionic etching, where the etching time depends on the thickness of the applied sacrificial polymer layer. This material begins to decompose at approximately 350° C. and is completely decomposed into volatile decomposition constituents within approximately 1 to 2 hours at temperatures between 400° C. and 430° C.

FIG. 5 shows a schematic top view of the wiring substrate 5 according to FIG. 4, where the media channel structure 21 is visible. The media channel structure 21 becomes wider on the top side 14 of the semiconductor component 4, so that the entire sensor area 15 is covered by the media channel structure 21, but the bond wires 25 remain free of the media channel structure 21. Between the semiconductor component positions 20, the inlet areas 9 and the outlet areas 10 of the media channel structure 21 are arranged at the boundaries marked with dashed line 32.

Figure 6:
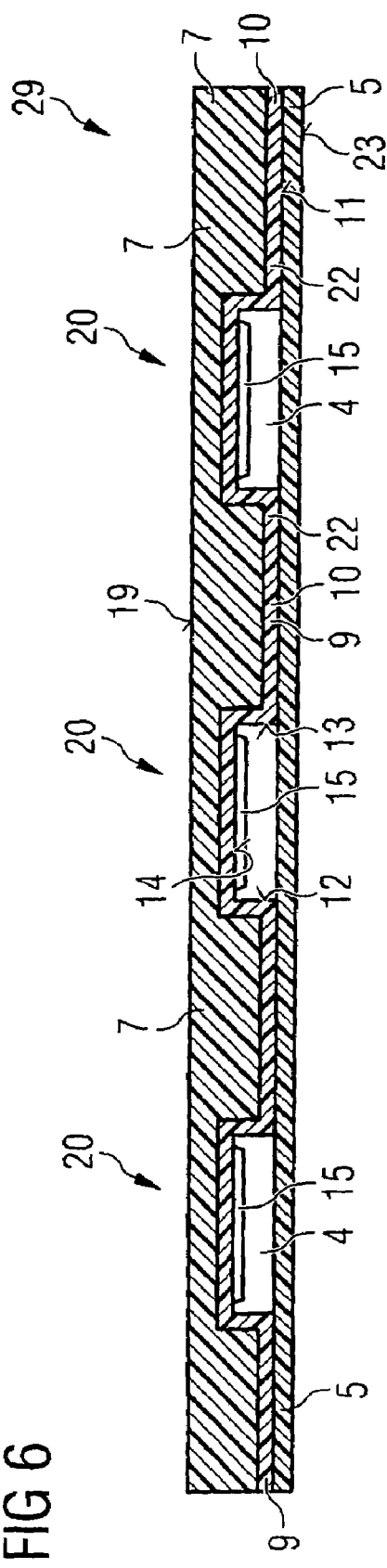
FIG. 6 depicts a cross-section through the wiring substrate according to FIG. 5 after applying a plastic housing mass.

FIG. 6 shows a cross-section through the wiring substrate 5 according to FIG. 5 after application of a plastic housing mass 7. This plastic housing mass 7 with its planar top side 19 in the semiconductor component positions 20 at the same time forms the top sides 19 of the semiconductor components.

Figure 7:
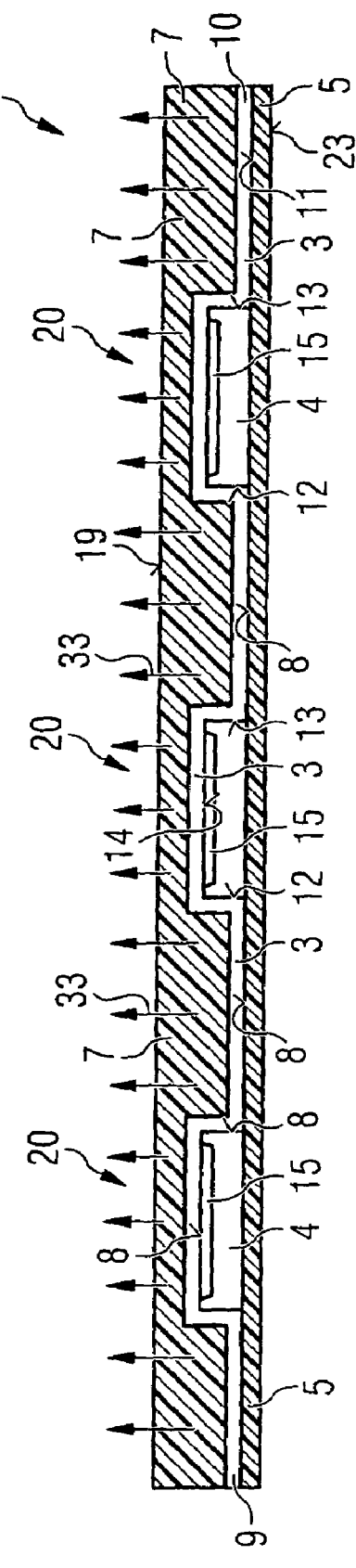
FIG. 7 depicts a cross-section through the wiring substrate according to FIG. 6 in decomposition of the sacrificial polymer of the media channel structure.

FIG. 7 shows a cross-section through the wiring substrate 5 according to FIG. 6 in decomposition of the sacrificial polymer of the media channel structure 21. To achieve this, the wiring substrate 5 with the plastic housing mass 7 and the sacrificial polymer 22, as shown in FIGS. 4, 5 and 6, is decomposed at a temperature between 400° C. and 450° C. into volatile constituents that diffuse outward through the plastic housing mass 7 in the direction of the arrow 33 and leave behind a media channel 3, which becomes wider to form a cavity 34 on the semiconductor top side 14.

Even before separating the panel 29, as shown in FIG. 7, into individual semiconductor components, external contacts may be applied to the bottom side 23 of the wiring substrate 5.

Figure 8:
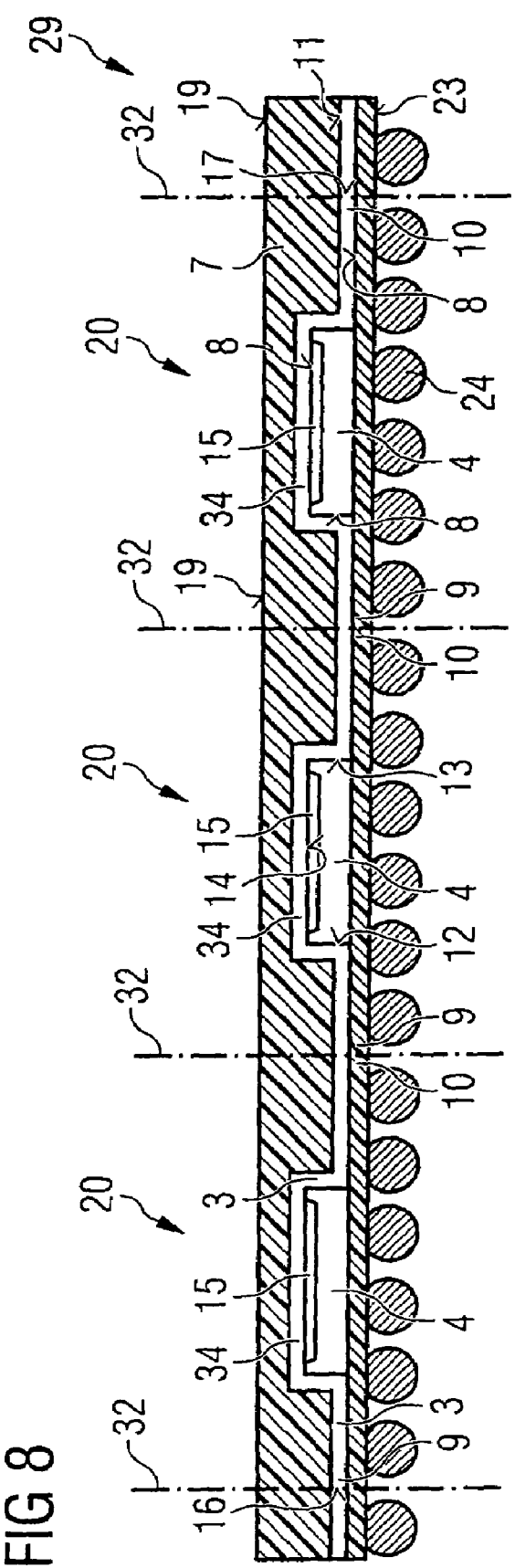
FIG. 8 depicts a schematic cross-section through a wiring substrate according to FIG. 7 after applying external contacts.

FIG. 8 shows a schematic cross-section through a wiring substrate 5 according to FIG. 7 after application of external contacts 24. After this step, it is now possible to separate the panel 29 and/or the wiring substrate 5 with the media channel 3 and the plastic housing mass 7 into individual semiconductor components along the dashed lines 32.

Figure 9:
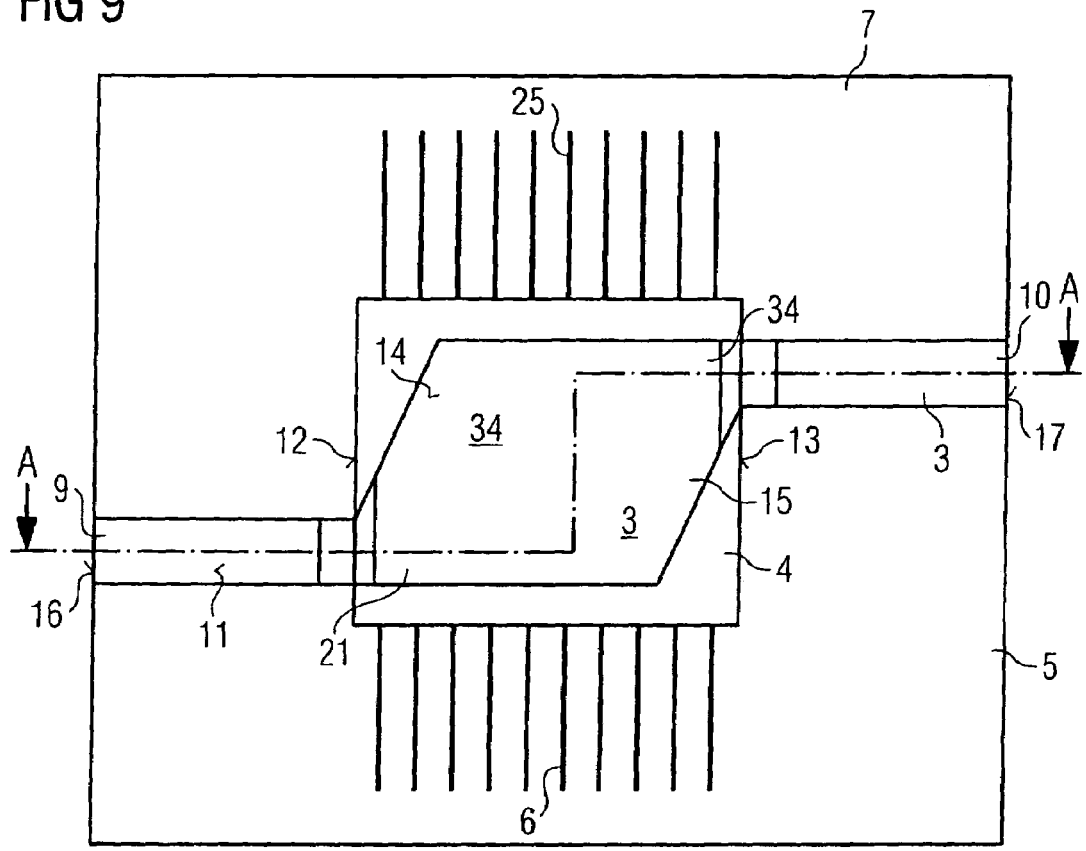
FIG. 9 depicts a schematic top view of a single semiconductor component after separating the wiring substrate according to FIG. 8, shown here as a sectional view in the area of the media channel structure.

FIG. 9 shows a schematic top view with a cross-section in the area of the media channel structure 21, showing a single semiconductor component 1 after separating the wiring substrate 5 according to FIG. 8. In this embodiment of the invention, the cavity 34 does not correspond completely to the size of the sensor area 15 of the semiconductor chip 4, as shown in the preceding figures, but instead the cavity 34 extends only partially over the sensor area 15 and in this embodiment of the invention it is designed to be favorable from the standpoint of flow from the inlet area 9 to the outlet area 10 in the area of the sensor area 34. However, the bond wires 25 are completely embedded in the plastic housing mass 7, the position of the bond wires 25 being illustrated here only schematically.

Figure 10:
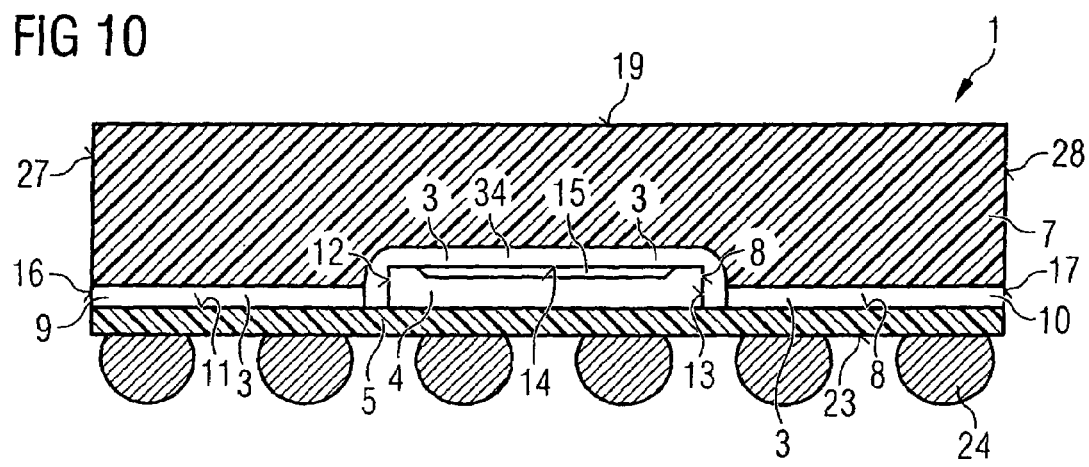
FIG. 10 depicts a schematic cross-section through the semiconductor component with a media channel according to the first embodiment of the invention.

FIG. 10 shows a schematic cross-section along sectional line A-A in FIG. 9 through the semiconductor component 1 with the media channel 3 according to the first embodiment of the invention. To avoid repetition, a detailed description of FIG. 10 is not given here because FIG. 10 corresponds with FIG. 1. However, it should be pointed out again that the openings 16 and 17 on the edge sides 27 and 28 of the semiconductor component 1 are formed only by separating the individual semiconductor component positions as shown in FIG. 8. Thus, a method of manufacturing such media channels 3 is provided, creating a crossover from the inlet area 9 and the outlet area 10 to the cavity 34 over the sensor area 15 within a semiconductor component 1 without any additional method steps.

Figure 11:
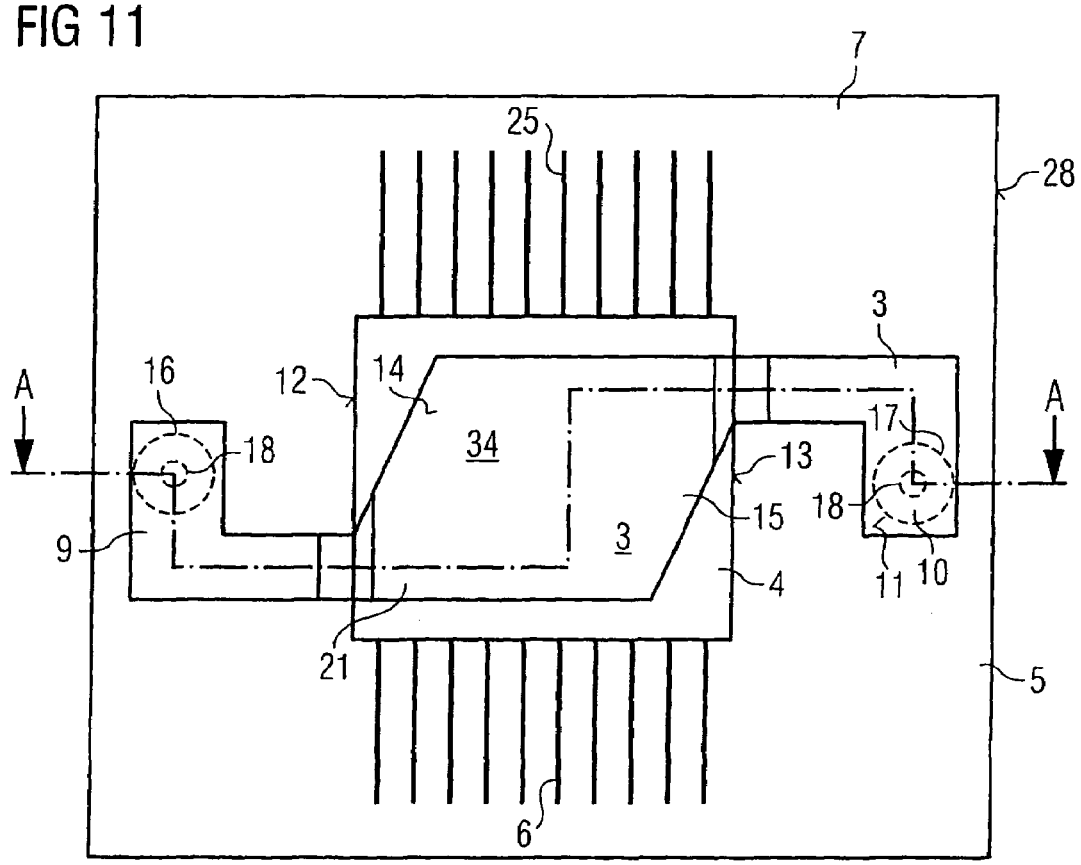
FIG. 11 depicts a schematic top view as a sectional view in the area of the media channel structure, showing a single semiconductor component according to a second embodiment of the invention.

FIG. 11 shows a schematic top view with a cross-section in the area of the media channel structure 21, showing a single semiconductor component 2 according to a second embodiment of the invention. Components having the same functions as those in the preceding figures are labeled with the same reference numerals and are not explained separately. The difference in comparison with the first embodiment of the invention consists of the fact that the inlet area 16 and the outlet area 17 are not continued to the edge sides 27 and 28 of the semiconductor component 2, but instead a broadened cavity arranged on the wiring substrate 5 is available as the inlet area 9 and the outlet area 10 of the media channel 3.

Figure 12:
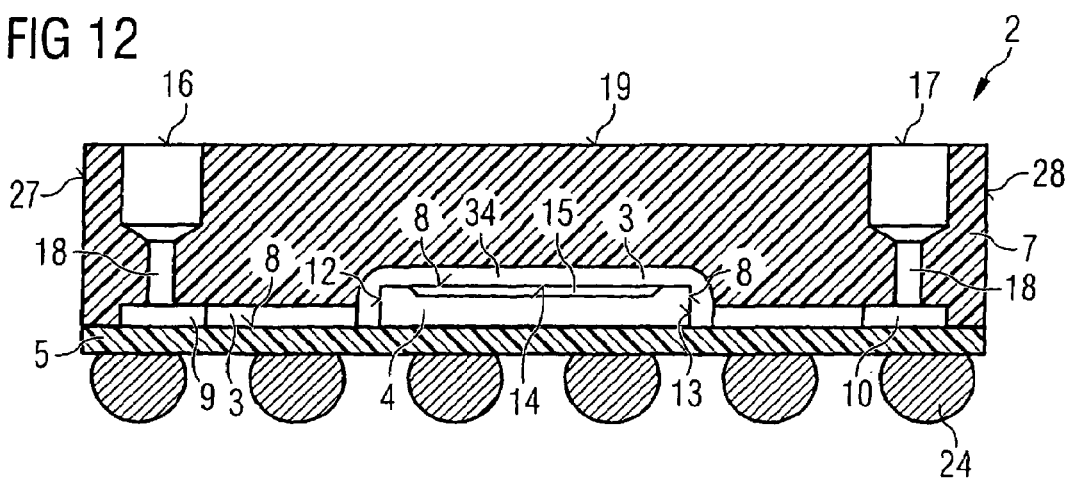
FIG. 12 depicts a schematic cross-section through a semiconductor component with a media channel according to the second embodiment of the invention.

FIG. 12 shows a schematic cross-section through a semiconductor component 2 with a media channel 3 according to the second embodiment of the invention. The inlet area 9 and the outlet area 10 are arranged on the top side 11 of the wiring substrate 5 as illustrated in FIG. 11, but there is no lateral opening to the edge sides 27 and 28 of the semiconductor component 2. An inlet opening 16 and an outlet opening 17 are instead arranged on the top side 19 of the semiconductor component 2 and are connected via vertical connecting channels 18 to the inlet area 9 and/or the outlet area 10 of the media channel on the interface of the semiconductor components. In this second embodiment of the invention, the structure of the inlet opening 16 and the outlet opening 17 and the vertical connecting channels 18 is created by laser ablation from the top side 19 of the plastic housing mass 7.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference numerals | |
| --- | --- |
| 1 | Semiconductor component (first embodiment) |
| 2 | Semiconductor component (second embodiment) |
| 3 | Media channel |
| 4 | Semiconductor chip |
| 5 | Wiring substrate |
| 6 | Electric connecting elements |
| 7 | Plastic housing mass |
| 8 | Interface between plastic housing mass and the components of the semiconductor component |
| 9 | Inlet area |
| 10 | Outlet area |
| 11 | Top side of the wiring substrate |
| 12 | Edge side of the semiconductor chip |
| 13 | Edge side of the semiconductor chip |
| 14 | Top side of the semiconductor chip |
| 15 | Sensor area |
| 16 | Inlet opening |
| 17 | Outlet opening |
| 18 | Connecting channel |
| 19 | Top side of the semiconductor component |
| 20 | Semiconductor component position |
| 21 | Media channel structure |
| 22 | Sacrificial polymer |
| 23 | Bottom side of the wiring substrate |
| 24 | External contact |
| 25 | Bond wire |
| 26 | Back side of the semiconductor chip |
| 27 | Edge side of the semiconductor component |
| 28 | Edge side of the semiconductor component |
| 29 | Panel |
| 30 | Edge side of the semiconductor chip |
| 31 | Edge side of the semiconductor chip |
| 32 | Dash-dot line |
| 33 | Direction of arrow |
| 34 | Cavity |

What is claimed is:

1. A method for manufacturing a semiconductor component including a media channel, the method comprising:
   manufacturing a wiring substrate including a plurality of semiconductor component positions;
   assembling the wiring substrate with semiconductor chips at the plurality of semiconductor component positions;
   applying a media channel structure comprising sacrificial polymers to a top side of the wiring substrate and to edge sides and top sides of the semiconductor chips;
   electrically connecting the wiring substrate to the semiconductor chips via electric connecting elements disposed at the semiconductor component positions;
   embedding the wiring substrate, semiconductor chips, connecting elements and media channel structure in a plastic housing mass;
   heating the wiring substrate to a decomposition temperature of the sacrificial polymers such that sacrificial polymer diffuse through the plastic housing mass and form media channels; and
   separating the wiring substrate into individual semiconductor components including media channels.

2. The method of claim 1, further comprising:
   prior to separating the wiring substrate into individual semiconductor components, assembling a bottom side of the wiring substrate with external contacts.

3. The method of claim 1, wherein the electric connection of the wiring substrate to the semiconductor chips comprises bonding bond wires between contact faces of the semiconductor chips and contact terminal faces of the wiring substrate at the semiconductor component positions.

4. The method of claim 1, wherein the electric connection of the wiring substrate to the semiconductor chips comprises soldering flip-chip contacts of the semiconductor chips to contact terminal faces of the wiring substrate at the component positions.

5. The method of claim 1, wherein the media channel structure of sacrificial polymers is applied using printing techniques.

6. The method of claim 1, wherein the media channel structure of sacrificial polymers is applied using a screen printing technique.

7. The method of claim 1, wherein the media channel structure of sacrificial polymers is applied using a stencil printing technique.

8. The method of claim 1, wherein the media channel structure of sacrificial polymers is applied using a jet printing technique.

9. The method of claim 1, wherein applying the media channel structure comprises applying a self-contained layer of a sacrificial polymer to the wiring substrate including semiconductor chips, and structuring the self-contained layer of the sacrificial polymer by photolithography.

10. The method of claim 1, wherein the wiring substrate, semiconductor chips, connecting elements and media channel structure are embedded in the plastic housing mass using dispensing techniques.

11. The method of claim 1, wherein the wiring substrate, semiconductor chips, connecting elements and media channel structure are embedded in the plastic housing mass using an injection molding technique.

* * * * *